United States Patent

[11] 3,631,357

[72] Inventor Dawson N. Hadley
Claremont, Calif.
[21] Appl. No. 805,484
[22] Filed Mar. 10, 1969
[45] Patented Dec. 28, 1971
[73] Assignee Marantz Co., Inc.
Sun Valley, Calif.

[54] AMPLIFIER
11 Claims, 2 Drawing Figs.

[52] U.S. Cl. .......... 330/17, 330/15, 330/22
[51] Int. Cl. .......... H03f 3/18
[50] Field of Search .......... 330/13, 17, 22, 40, 23, 15

[56] References Cited

UNITED STATES PATENTS

| | | | |
|---|---|---|---|
| 3,418,589 | 12/1968 | Yee | 330/17 X |
| 3,434,066 | 3/1969 | Huntley | 330/13 |
| 3,471,794 | 10/1969 | Gugliotti, Jr. | 330/23 |
| 3,484,867 | 12/1969 | Babcock | 330/13 |
| 2,761,917 | 9/1956 | Aronson | 330/15 |
| 2,896,029 | 7/1959 | Lin | 330/13 |
| 3,443,241 | 5/1969 | Pitzalis, Jr. | 330/22 X |
| 3,469,202 | 9/1969 | Priddy | 330/17 X |

*Primary Examiner*—Roy Lake
*Assistant Examiner*—Lawrence J. Dahl
*Attorney*—Fulwider, Patton, Rieber, Lee & Utecht

ABSTRACT: A solid-state audiopower amplifier using a single operational amplifier feeding a dual channel, substantially class A drive circuit for a pair of substantially class AB, complementary symmetry power amplification stages, distortion being controlled by the degree of conductive cycle overlap between the channels of the drive circuit, and power output being held to safe levels by a current limiting loop in each channel between each power amplification stage and its corresponding drive circuit. Temperature compensation is also provided.

INVENTOR.
DAWSON N. HADLEY
BY Zulwider, Patton, Rieber Lee, and Utecht
ATTORNEYS

AMPLIFIER

BACKGROUND OF THE INVENTION

This invention relates generally to amplifiers and, more particularly, to a new and improved audiopower amplifier characterized by relatively low distortion and high power output, high stability and reliability, while remaining relatively economical to manufacture.

Workers in the electrical arts, as well as high fidelity audio enthusiasts, constantly strive for better audioamplifiers capable of providing desired high power output levels while minimizing the introduction of various types of distortion and noise in the audio signal between the amplifier input and output. In recent years, with the advent of relatively low efficiency, linear response loudspeaker systems, the need for high power output with low distortion has become ever more critical.

A wide variety of different amplifier circuits have been developed to provide the desired levels of audiopower output. However, these prior art amplifier designs have been generally characterized by relatively complex circuitry requiring expensive, critically matched electrical components. In addition, many of these amplifier designs have either failed to achieve the desired low levels of distortion or proven relatively unstable, particularly in a thermal sense, or unreliable from the standpoint of protection against overloading and consequent damage to circuit components.

It will be apparent, therefore, that there has been a long existing need in the audioamplifier art for a relatively simple, relatively low cost, yet stable and reliable audiopower amplifier capable of relatively high power output levels without fear of overloading, and with a minimum of distortion. The present invention clearly satisfies this need.

SUMMARY OF THE INVENTION

Briefly, and in general terms, the present invention provides a new and improved amplifier circuit wherein a single-ended preamplifier output is directed to a drive circuit for a pair of complementary power output stages, the drive circuit being gated to provide each of the two output stages with overlapping conduction angles selected to minimize distortion. Limiting of the input to the drive circuit is also provided to avoid potentially dangerous overload conditions.

In a presently preferred embodiment of the amplifier of the present invention, by way of example and not necessarily by way of limitation, the preamplifier is typically a high-gain operational amplifier, and a complementary symmetry solid-state drive circuit is provided with variable biasing means for determining the degree of overlap in the conduction angles of the two power output stages. Furthermore, current limiting of the input signal to the drive circuit is accomplished by feedback from the output stages, so that power overload conditions and consequent damage to circuit components are circumvented.

In addition, the amplifier of the present invention typically utilizes feedback networks for temperature stabilization, balancing and gain control.

The audioamplifier of the present invention is provided in a relatively simple, yet very stable and highly reliable solid state configuration. Values of circuit components are relatively noncritical and the amplifier is susceptible to relatively easy and inexpensive manufacture on a large scale with highly consistent results in maintaining performance specifications regarding power output, distortion and the like.

The above and other objects and advantages of the invention will be better understood by reference to the following more detailed description, when considered in connection with the accompanying drawing of illustrative embodiments.

DESCRIPTION OF THE PREFERRED EMBODIMENTS

Figure 1:
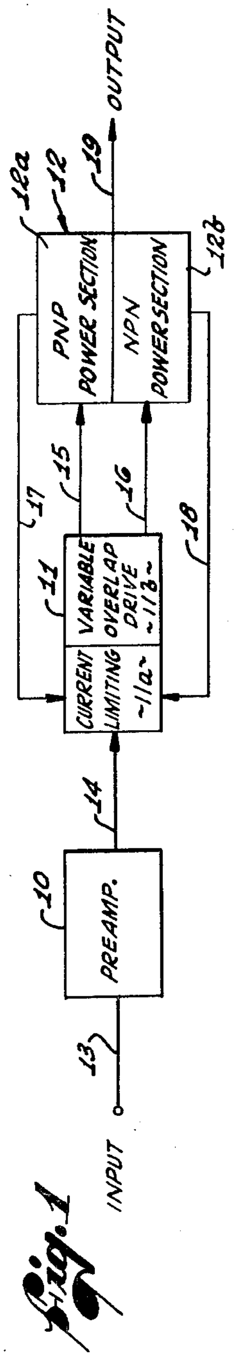
FIG. 1 is a block diagram illustrating the primary subsystems typically encountered in an amplifier constructed in accordance with the present invention.

Referring now to the drawing, and particularly to FIG. 1 thereof, there is shown a new and improved amplifying system embodying the novel features of the present invention. The amplifier system includes a preamplifier stage 10, a drive stage 11 and a power amplification stage 12.

The preamplifier stage 10 is typically a high-gain operational amplifier. The drive stage 11 includes a current limiting section **11*a* and a variable overlap drive section 11*b*. The power amplification stage 12 includes a pair of complementary symmetry NPN-PNP-power sections 12*b* and 12*a***, respectively.

The input signal is directed over line 13 to the preamplifier 10 which provides a single-ended output over line 14 as input to the drive stage 11. The variable overlap drive section **11*b* is a dual channel circuit providing the equivalent of a double-ended output over lines 15 and 16 to the complementary power sections 12*a* and 12*b*. Means are provided within the variable overlap drive section 11*b*** for varying the degree of overlap in the conduction angles for the two power sections in order to minimize distortion, particularly at high power output levels.

Feedback is provided from each of the power sections **12*a* and 12*b* over lines 17 and 18, respectively, to the current limiting section 11*a* of the drive stage 11. This feedback in each power channel controls the conductivity of an appropriate solid-state current limiting device at the input to the variable overlap drive section 11*b*** for each channel. In this way, potentially damaging overload conditions are rapidly sensed, and current limiting of the input signals is accomplished, prior to the occurrence of any actual damage to circuit components.

The basic amplifying system shown in FIG. 1 is capable of relatively high power output over line 19, with a minimum of distortion and without fear of electrical overloading.

Figure 2:
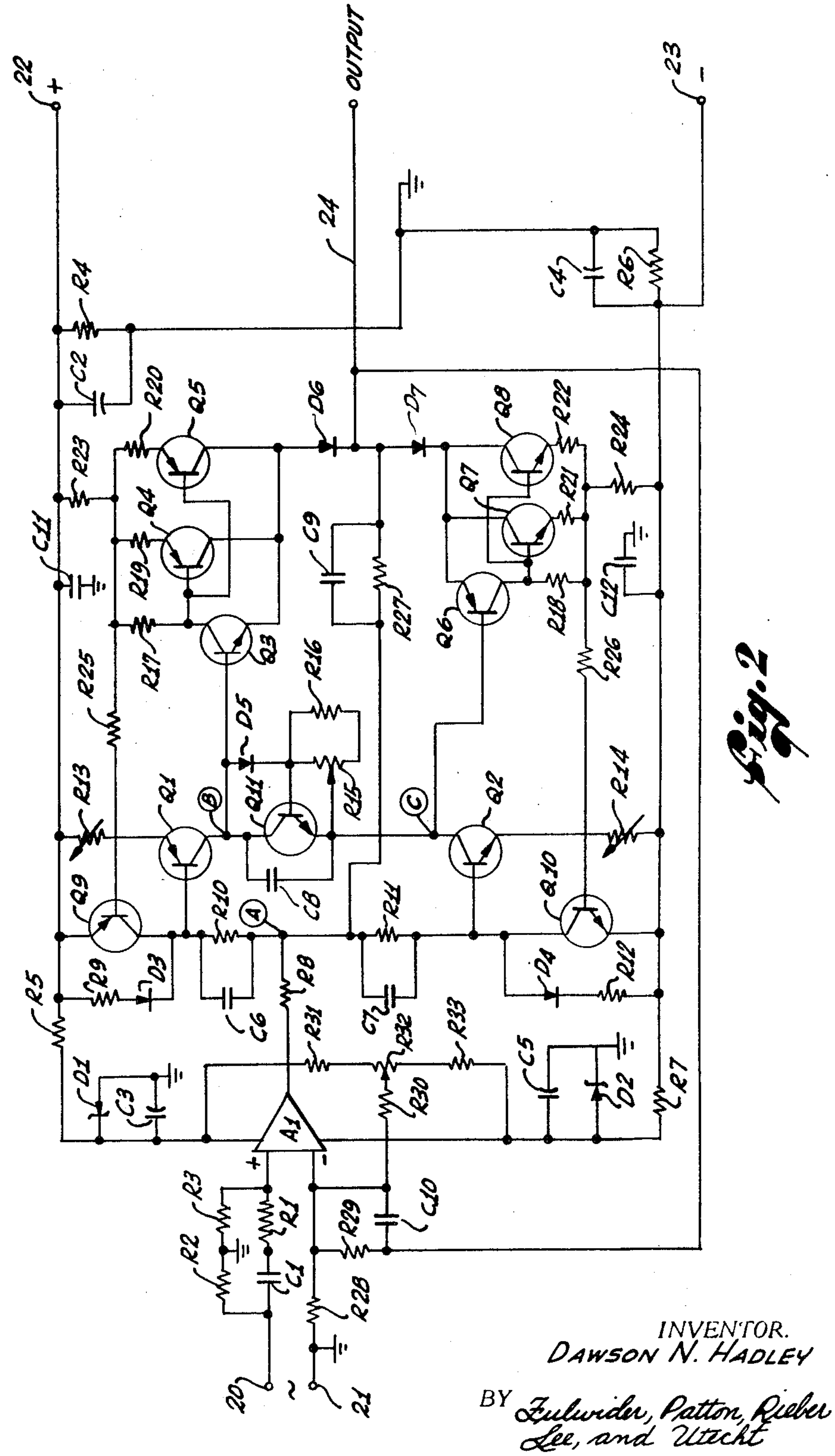
FIG. 2 is an electrical schematic diagram of a presently preferred embodiment of an audioamplifier constructed in accordance with the invention.

Referring now to FIG. 2 of the drawing, there is shown an electrical circuit for a presently preferred embodiment of an amplifier system constructed in accordance with the present invention.

Essentially, with respect to the active elements of the circuit shown in FIG. 2, the function of the preamplifier 10 in FIG. 1 is carried out by a high-gain operational amplifier A1 in FIG. 2. The function of the variable overlap drive section **11*b* is carried out by a pair of transistors Q1 and Q2 and associated components. The function of the power section 12*a* is carried out by the transistors Q3, Q4 and Q5 and associated components in FIG. 2. Similarly, the function of the power section 12*b*** is carried out by the transistors Q6, Q7 and Q8 and their associated components.

The function of the current limiting section **11*a* of the drive section 11** in FIG. 1 is carried out by the transistors Q9 and Q10 and associated components in FIG. 2.

The signal to be amplified is introduced as an electrical input between a pair of input terminals 20, 21, the terminal 21 being grounded. The input signal is then directed through a capacitor C1 and a resistor R1 to the positive input terminal of the operational amplifier A1. The capacitor C1 is a decoupling capacitor to remove any DC components from the input signal to the amplifier A1. The resistor R1 is a current limiting resistance to prevent overdriving of the amplifier A1.

A resistor R2 provides a high impedance DC return to ground for the capacitor C1, while a resistor R3 is connected between the positive input to the amplifier A1 and ground to provide the proper DC bias for the positive input of the amplifier A1.

Electrical power for the amplifier system is provided by any suitable DC power supply (not shown) appropriately connected between a positive terminal 22 and a negative terminal 23, the typical power supply voltages applied being +46 volts DC and −46 volts DC, respectively. The positive supply voltage is filtered by a resistor R4 and parallel capacitor C2 and is directed through a dropping resistor R5 to a Zener diode D1 so that the +46 volts DC input at terminal 22 is reduced to a regulated +15 volts DC input to the operational amplifier A1. A capacitor C3 is connected across the Zener diode D1 for additional filtering and to eliminate Zener noise.

Similarly, the negative voltage applied to terminal 23 is filtered by a resistor R6 and a capacitor C4, passes through a dropping resistor R7 to a Zener diode D2 and associated parallel capacitor C5, so that a regulated −15 volts DC is supplied to the amplifier A1.

The single-ended output of the preamplifier A1 is directed through a current limiting resistor R8 to a voltage divider network comprising resistors R9, R10, R11, R12 and diodes D3, D4. The resistors R9 and R10 establish the quiescent DC operating conditions for the PNP-driver transistor Q1, whereas the resistors R11 and R12 establish the quiescent DC bias for the NPN-driver transistor Q2.

Diodes D3 and D4 provide thermal compensation by regulating the DC bias of the transistors Q1 and Q2 for ambient temperature changes.

A capacitor C6 in parallel with the resistor R10, and a capacitor C7 in parallel with the resistor R11, provide high-frequency bypass paths around these resistors.

The single-ended AC signal input is passed, depending on polarity, either through resistors R9, R10 and diode D3 or the network defined by the resistors R11, R12 and diode D4.

By way of example, if a negative signal is applied to point A between the resistors R10 and R11, the PNP-transistor Q1 is turned on while the PNP-transistor Q2 is turned off, so that transistor Q2 provides an almost infinite load in the collector circuit of the transistor Q1 except for the minimal loading of the transistors Q6 and Q7.

When the transistor Q1 turns on, its collector voltage at point B goes positive, thus turning on the NPN-power stage input transistor Q3 and driving the collector of the latter transistor negative. Since the base electrodes of both of the PNP-power transistors Q4, Q5 are tied to the collector electrode of the input transistor Q3, both of the transistors Q4 and Q5 are turned on and their collectors are driven positive.

Similarly, if a positive signal is applied at point A, the driver transistor Q2 is turned on and Q1 is essentially turned off to provide an almost infinite load in the collector circuit of the transistor Q2 except for the minimal loading provided by the transistors Q3 and Q4.

When the transistor Q2 turns on, its collector voltage at point C goes negative which, in turn, turns on the PNP-power stage input transistor Q6. When the transistor Q6 turns on, its collector goes positive which, in turn, renders the NPN-power transistors Q7 and Q8 conductive so that the collector electrodes of the latter power transistors are driven negative.

In the aforementioned manner, the single-ended signal input to point A is divided into two current amplifier channels by means of the power input division accomplished by the complementary symmetry driver transistors Q1 and Q2. The driver transistors Q1 and Q2 operate together in a substantially class A mode with each of the transistors Q1 and Q2 having overlapping conduction angles. In this regard, each of the transistors Q1 and Q2 will typically conduct over approximately 60 percent of the signal cycle, the degree of conduction angle overlap between the transistors Q1 and Q2 being selected to minimize signal distortion.

The conduction angles of the driver transistors Q1 and Q2 and, hence, the degree of overlap between the two amplifier channels is adjusted by means of a variable resistor R13 in the emitter-base circuit of the transistor Q1 and a similar variable resistor R14 in the emitter-base circuit of the transistor Q2, which establish the emitter bias for the driver transistors. In this connection, as the magnitude of the resistor R13 decreases, the transistor Q1 conducts over a greater portion of the signal cycle, and the conduction angle overlap between the transistors Q1 and Q2 increases. Similarly, as the magnitude of the resistor R14 decreases, the conduction angle of the transistor Q2 increases, as does its overlap with the conduction angle of the transistor Q1. The degree of conduction angle overlap is essentially a function of the ratio of resistor R13 to resistor R9 and of resistor R14 to resistor R12.

It will also be observed that the driver transistors Q1 and Q2, cooperating with the input transistors Q3 and Q6, respectively, define a power input divider for a pair of complementary PNP-NPN-current amplifier channels represented by the power transistors Q4, Q5 and power transistors Q7, Q8, respectively, The electrical output from both channels is combined and directed over line 24, the output being essentially the electrical equivalent of substantially class AB push-pull output.

An NPN-transistor Q11 has its emitter-collector circuit connected between the collectors of the driver transistors Q1 and Q2 and between the base electrodes of the power stage input transistors Q3 and Q6.

The transistor Q11, together with a pair of resistors R15, R16 and a diode D5 establish the quiescent DC operating conditions for the power transistors Q4, Q5 and Q7, Q8. The latter biasing network, together with a pair of diodes D6 and D7 connected between the output collectors of the two power amplifier channels, also provide a temperature compensated feedback loop to prevent thermal runaway.

Transistor Q11 and diode D5 provide direct stabilization for variations in the ambient temperature and temperature of the power transistors. As the total temperature of the system increases, the current through the transistors Q4, Q5, Q7 and Q8 will increase, causing an increased voltage drop across the diodes D6 and D7 which, in turn, drives the emitter of the transistor Q6 more negative. The latter tends to bias the power transistors Q7 and Q8 to a lower DC bias current. Similarly, the emitter of the transistor Q3 will be driven more positive, so that the power transistors Q4 and Q5 are likewise biased to lower current levels.

The net effect of the temperature compensation provided by the transistor Q11, diode D5, resistors R15, R16 and diodes D6, D7 is that the DC operating point for the amplifying system can be maintained almost constant for as much as a 150° C. change in temperature.

A capacitor C8 provides a high-frequency bypass around the transistor Q11 in the collector circuits of the driver transistors Q1 and Q2.

A resistor R17 provides the collector load for the driver transistor Q3 and also provides a DC return path for base-emitter circuits of the power transistors Q4 and Q5. Likewise, a resistor R18 provides the collector load for the transistor Q6 and a DC return for the power transistors Q7 and Q8.

An emitter resistor R19 for the transistor Q4 and an emitter resistor R20 for the power transistor Q5 are used as essentially equal load resistors to equalize the gain of these power transistors. Emitter resistors R21 and R22 perform the same function for the power transistors Q7 and Q8.

A small resistor R23 connected between the positive voltage supply line and the emitter circuits of the transistors Q4 and Q5 monitors the current passing through the power transistors to provide a feedback voltage to a limiting transistor Q9 in the base-emitter input circuit of the driver transistor Q1. When the power output of the transistors Q4 and Q5 reaches a sufficiently high level, sufficient voltage is developed across the resistor R23 to turn on the transistor Q9. When Q9 conducts, the maximum amplitude of the input signal at the base of the driver transistor Q1 is limited, thus controlling the maximum power output of the amplifier channel fed by transistor Q1.

Similarly, a resistor R24 monitors the current flowing through the power transistors Q7 and Q8 and, when the current reaches a predetermined level, a transistor Q10 is turned on to limit the input signal to the base of the driver transistor Q2.

Hence, the resistors R23, R24 and limiting transistors Q9 and Q10 effectively control the maximum power output of the amplifier system and prevent potentially damaging overload conditions from occurring.

A small resistor R25 in the base circuit of the limiting transistor Q9 and a similar resistor R26 in the base circuit of the limiting resistor Q10, are used to protect the limiting transistors from damage due to excessive current.

A resistor R27 is connected between the output line 24 and point A of the input circuit to the driver transistors Q1 and Q2. The resistor R27 and input resistor R8 provide a feedback loop for controlling the gain of that portion of the amplifier system other than the preamplifier A1. A capacitor C9, in parallel with the feedback resistor R27, is used for high-frequency rolloff to prevent oscillation.

A second feedback loop from the output line 24 to the input terminal 21 of the entire amplifier system is comprised of series resistors R28 and R29. This outer feedback loop controls the AC and DC voltage gain of the entire amplifier system.

A small capacitor C10 is provided in parallel with the resistor R29 to set the upper limit of the overall frequency response of the amplifier system.

Direct current balancing in the amplifier system is accomplished by means of a voltage divider string comprising resistors R31, R32 and R33 connected between the positive and negative regulated DC voltage inputs to the operational amplifier A1. The resistor R32 is variable and is adjusted to provide a very small DC voltage, via a high impedance resistor R30, into the negative input of the amplifier A1 to set the DC output of the entire amplifier system at output line 24 to zero, thus accomplishing a DC balance function.

The capacitors C11 and C12 connected between the positive and negative supply lines, respectively, and ground are used merely to provide a suitable high-frequency bypass for the power supply.

Typical component values for the circuitry of FIG. 2 are as follows:

| | |
|---|---|
| A1 | Type MC1741 Operational Amplifier (Motorola) |
| Q1 | Type 2N5322 Transistor (Motorola) |
| Q2 | Type 2N5320 Transistor (Motorola) |
| Q3 | Type 2N3766 Transistor (Motorola) |
| Q4, Q5 | Type 2N3790 Transistor (Motorola) |
| Q6 | Type 2N3740 Transistor (Motorola) |
| Q7, Q8 | Type 2N3715 Transistor (Motorola) |
| Q9 | Type 2N3638 Transistor (Motorola) |
| Q10 | Type 2N3568 Transistor (Motorola) |
| R1 | 1 kilohm |
| R2 | 470 kilohms |
| R3 | 47 kilohms |
| R4, R6 | each 2.2 kilohms, 2 watts |
| R5, R7 | each 1.5 kilohms, 1 watt |
| R8, R9, R12 | each 300 ohms |
| R10, R11 | each 15 kilohms |
| R13, R14 | each 0–100 ohms, typically set at 56 ohms |
| R15 | 0–1 kilohm |
| R16 | 100 ohms |
| R17, R18 | 100 ohms, 1 watt |
| R19, R20, R21, R22 | each 0.15 ohm |
| R23, R24 | each 0.08 ohm |
| R25, R26 | each 47 ohms |
| R27 | 18 kilohms |
| R28 | 820 ohms |
| R29 | 22 kilohms |
| R30 | 1 megohm |
| R31 | 0–2 kilohms |
| R32, R33 | each 10 kilohms |
| C1 | 1 microfarad, 200 volts |
| C2, C4 | each 5,000 microfarads, 50 volts |
| C3, C5 | each 10 microfarads, 25 volts |
| C6, C7 | each 0.1 microfarad, 200 volts |
| C8 | 0.22 microfarad, 200 volts |
| C9 | 33 picofarads, 500 volts |
| C10 | 100 picofarads, 500 volts |
| C11, C12 | each 0.05 microfarad, 500 volts |
| D1, D2 | each Type 1N965 Zener diode (Motorola) |
| D3, D4 | each Type 1N4001 diode (Motorola) |
| D5 | Type MZ2362 diode (Motorola) |
| D6 | Type MR1120R diode (Motorola) |
| D7 | Type MR1120 diode (Motorola) |

The amplifier of the present invention is characterized by relatively high power output with extremely low distortion. In addition, component values are relatively noncritical and the system is easily adjusted to performance specifications. In this regard, the conduction angles of the driver channels are readily adjusted by the variable resistors R13 and R14 to minimize distortion in the output, and DC balance is accomplished by adjustment of the resistor R32. The amplifier of the present invention is extremely stable and reliable, in that it will not overload and damage vital components, and the circuitry will hold to its performance specifications over a very wide temperature range.

It will be apparent from the foregoing that, while particular forms of the invention have been illustrated and described, various modifications can be made without departing from the spirit and scope of the invention.

I claim:

1. A driver amplifier system for a push-pull power amplifier, comprising:

a preamplifier;

a pair of driver transistors arranged in complementary symmetry circuit, each of said transistors having a base, emitter and collector electrodes, said transistors receiving the electrical signal output of said preamplifier as electrical signal input to their base electrodes; and variable biasing means in the base-emitter circuit of each of said driver transistors, said biasing means being empirically adjusted for establishing the optimum combination of conduction angle of each transistor and degree of conduction angle overlap of both of said driver transistors to generate driving signals for said push-pull power amplifier having minimum signal distortion, said conduction angle overlap being substantially between 25° and 60°.

2. A driver amplifier system as set forth in claim 1, wherein said biasing means includes a resistive voltage divider network.

3. An amplifier system, comprising:

a preamplifier stage having a single-ended electrical output;

an NPN-driver transistor and a PNP-driver transistor electrically connected in a complementary symmetry circuit, each of said transistors having a base, emitter and collector electrodes, said driver transistors receiving the single-ended output of said preamplifier stage as a common driving input to their base electrodes;

variable biasing means in the base-emitter circuit of each of said driver transistors for establishing the optimum combination of conduction angle of each transistor and degree of conduction angle overlap between said driver transistors, at least one of said biasing means being empirically adjusted to establish minimum signal distortion of said electrical outputs of said driver transistors, said conduction angle overlap being substantially between 25° and 60°;

a pair of complementary symmetry power amplifier stages, each of said stages being adapted to receive as electrical input said electrical output of one of said driver transistors; and means responsive to the electrical output of each of said power amplifier stages for controlling said biasing means to vary said combination of conduction angle of each of said driver transistors and the degree of conduction angle overlap of said driver transistors to selectively limit said driving input to said base electrodes of said driver transistors.

4. An amplifier system as set forth in claim 3, and further including:

thermal compensation means electrically connected between the output of said power amplifier stages and said driver transistors for stabilizing the quiescent operating conditions of said amplifier system over a wide range of temperature variation.

5. An amplifier system as set forth in claim 4, wherein each of said biasing means includes a voltage divider network.

6. A driver amplifier system as set forth in claim 1, and further including:

means for temperature stabilizing the quiescent operating conditions of said transistors.

7. An amplifier system, comprising:

a preamplifier;

a pair of driver transistors having base, emitter, and collector electrodes, said transistors being arranged in a complementary symmetry circuit with said bases of said transistors receiving the electrical signal inputs to said preamplifier as electrical signal inputs to said transistors, said complementary symmetry circuit having a pair of complementary signal outputs;

biasing means in the base-emitter circuit of each of said driver transistors, each of said biasing means being independently variable to adjust the combination of conduction angle of each of said driver transistors and degree of conduction angle overlap of both of said transistors to empirically establish minimum signal distortion of said complementary signal outputs, said conduction angle overlap being substantially between 25° and 60°; and a pair of complementary symmetry power amplification stages, said stages receiving as their electrical input said complementary signal outputs.

8. An amplifier system as set forth in claim 7 and further including:

means responsive to the electrical output of said power amplification stages for varying said biasing means to vary said combination of conduction angle of each of said driver transistors and the degree of conduction angle overlap of said driver transistors to selectively limit said electrical signal inputs to said base electrodes of said transistors.

9. An amplifier system as set forth in claim 7, and further including:

means responsive to the electrical output of said power amplification stages for temperature stabilizing the quiescent operating conditions of said amplifier system.

10. An amplifier system, comprising:

a preamplifier stage having a single-ended electrical output, said preamplifier stage including an operational amplifier;

an NPN-driver transistor and a PNP-driver transistor electrically connected in a complementary symmetry circuit, each of said transistors having a base, emitter, and collector electrodes, said driver transistors receiving the single-ended output of said preamplifier stage as a common driving input to their base electrodes;

biasing means including a voltage divider network in the base-emitter circuit of each of said driver transistors for establishing the conduction angle of each transistor and the optimum degree of conduction angle overlap between said driver transistors for minimum signal distortion;

a pair of complementary symmetry power amplifier stages, each of said stages being adapted to receive as electrical input the electrical output of one of said driver transistors;

means responsive to the electrical output of each of said power amplifier stages for controlling said biasing means to selectively limit said driving input to said base electrodes of said driver transistors, said responsive means including a PNP-transistor having its emitter-collector circuit in the base-emitter circuit of said NPN-driver transistor; and thermal compensation means electrically connected between the output of said power amplifier stages and said driver transistors for stabilizing the quiescent operating conditions of said amplifier system over a wide range of temperature variation.

11. An amplifier system as set forth in claim 10, wherein one of said complementary symmetry power amplifier stages includes a pair of NPN-power transistors connected in parallel, and the other of said power amplifier stages includes a pair of PNP-power transistors connected in parallel.

* * * * *

UNITED STATES PATENT OFFICE
CERTIFICATE OF CORRECTION

Patent No. 3,631,357 Dated December 28, 1971

Inventor(s) Dawson N. Hadley

It is certified that error appears in the above-identified patent and that said Letters Patent are hereby corrected as shown below:

Column 3, line 32, after "the" delete "PNP" and insert therefor -- NPN --.

Signed and sealed this 6th day of June 1972.

(SEAL)
Attest:

EDWARD M.FLETCHER,JR.
Attesting Officer

ROBERT GOTTSCHALK
Commissioner of Patents